(12) United States Patent
Jing et al.

(10) Patent No.: US 10,226,868 B2
(45) Date of Patent: Mar. 12, 2019

(54) POST POSITION ADJUSTMENT DEVICE, CASSETTE ADJUSTMENT DEVICE AND SUBSTRATE CONVEYANCE SYSTEM

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Yangkun Jing, Beijing (CN); Shengguang Sang, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 326 days.

(21) Appl. No.: 15/175,875

(22) Filed: Jun. 7, 2016

(65) Prior Publication Data
US 2016/0368145 A1 Dec. 22, 2016

(30) Foreign Application Priority Data
Jun. 19, 2015 (CN) .......................... 2015 1 0346518

(51) Int. Cl.
| | | |
|---|---|---|
| *B25J 9/16* | (2006.01) | |
| *B25J 19/02* | (2006.01) | |
| *B25J 11/00* | (2006.01) | |
| *B25J 15/02* | (2006.01) | |

(52) U.S. Cl.
CPC ........... *B25J 9/1687* (2013.01); *B25J 9/1679* (2013.01); *B25J 9/1684* (2013.01); *B25J 19/023* (2013.01); *B25J 11/0095* (2013.01); *B25J 15/02* (2013.01)

(58) Field of Classification Search
CPC ...... B25J 9/1679; B25J 9/1684; B25J 9/1687; B25J 11/0095; B25J 15/02; B25J 19/023
USPC ......... 414/273, 277, 281, 751.1; 901/16, 23; 369/30.31; 360/92.1
See application file for complete search history.

(56) References Cited

U.S. PATENT DOCUMENTS

| | | | | |
|---|---|---|---|---|
| 4,714,400 | A * | 12/1987 | Barnett ................ | G05B 19/232 318/38 |
| 5,093,978 | A * | 3/1992 | Binder ................. | B23Q 3/1554 414/751.1 |
| 7,329,081 | B2 * | 2/2008 | Baker ...................... | B65G 1/04 414/268 |
| 7,676,278 | B2 * | 3/2010 | Sasaki .................. | G11B 15/689 369/30.27 |

(Continued)

*Primary Examiner* — Jermie Cozart
(74) *Attorney, Agent, or Firm* — Brooks Kushman P.C.

(57) ABSTRACT

The present disclosure provides a post position adjustment device, a cassette adjustment device and a substrate conveyance system. The post position adjustment device includes: a post-picking-and-placing unit configured to pick a post out from current positioning hole and install the post into a target positioning hole; a movement mechanism configured to move the post-picking-and-placing unit; and a movement control unit configured to control the movement mechanism to move the post-picking-and-placing unit to a source position where the post is currently located, and after the post has been picked out from the current positioning hole by the post-picking-and-placing unit, control the movement mechanism to move the post-picking-and-placing unit to a target position.

20 Claims, 4 Drawing Sheets

(56) References Cited

U.S. PATENT DOCUMENTS

| | | | |
|---|---|---|---|
| 7,819,621 B2* | 10/2010 | Veit | B21D 43/006 414/730 |
| 2005/0053450 A1* | 3/2005 | Kantola | B65G 1/0407 414/273 |

* cited by examiner

POST POSITION ADJUSTMENT DEVICE, CASSETTE ADJUSTMENT DEVICE AND SUBSTRATE CONVEYANCE SYSTEM

CROSS-REFERENCE TO RELATED APPLICATION

The present application claims a priority of the Chinese patent application No.201510346518.5 filed on Jun. 19, 2015, which is incorporated herein by reference in its entirety.

TECHNICAL FIELD

The present disclosure relates to conveyance of substrates, in particular to a post position adjustment device, a cassette adjustment device, and a substrate conveyance system.

BACKGROUND in the related art, for a cassette that accommodates therein display substrates obtained after a cuffing process, it is necessary to manually adjust positions of posts on positioning bars of the cassette in accordance with different sizes of the display substrates, resulting in a waste of labor and time. In addition, operational errors may usually occur during the manual adjustment of the cassette, so the size of the display substrate in the adjusted cassette may be inconsistent with the desired size. At this time, during the operation, a cutting unloader robot may collide with the cassette (CST), resulting in losses of production materials and time.

SUMMARY

A main object of the present disclosure is to provide a post position adjustment device, a cassette adjustment device and a substrate conveyance system, an as to automatically adjust a post position and a cassette.

In one aspect, the present disclosure provides in some embodiments a post position adjustment device, including: a post-picking-and-placing unit configured to pick a post out from a current positioning hole and install the post into a target positioning hole; a movement mechanism configured to move the post-picking-and-placing unit; and a movement control unit configured to move the post-picking-and-placing unit; and a movement control unit configured to control the movement mechanism to move the post-picking-and-placing unit to a source position where the post is currently located, and after the post has been picked out from the current positioning hole by the post-picking-and-placing unit to a target position.

Alternatively, the post-picking-and-placing unit includes: a clamping module configured to pick the post out from the current positioning hole and install the post into the target positioning hole; a clamping control module configured to, after the movement mechanism moves the post-picking-and-placing unit to the source position, generate a clamping control signal for controlling the clamping module to pick the post out from the current positioning hole; and an installation control module configured to, after the movement mechanism moves the post-picking-and-placing unit to the target position, generate an installation control signal for controlling the clamping module to install the post into the target positioning hole.

Alternatively, the movement mechanism includes: a first guide rail parallel to a positioning bar in which the positioning hole is, a plane defined by the first guide rail and the positioning bar being perpendicular to a plane where the positioning bar is located; a second guide rail perpendicular to the plane where the positioning bar is located; and a movable bearing unit movable along the first guide rail and configured to bear the clamping module. The first guide rail is movable along the second guide rail.

Alternatively, the movement control unit includes: a first position adjustment module configured to control the movable bearing unit to move along the first guide rail; and a second position adjustment module configured to control the first guide rail to move along the second guide rail.

Alternatively, the first guide rail includes a first guide sub-rail, the clamping module includes a first clamping unit, and the movable bearing unit includes a first movable bearing module for controlling the first clamping unit to move along the first guide sub-rail.

Alternatively, the movement mechanism further includes a third guide rail perpendicular to the plane where the positioning bar is located, and the first guide rail is movable along the third guide rail. A first end of the first guide sub-rail is connected to the second guide rail, and a second end of the first guide sub-rail is connected to the third guide rail.

Alternatively, the first guide rail further includes a second guide sub-rail and a third guide sub-rail, and a length of the second guide sub-rail and a length of the third guide sub-rail are each less than a length of the first guide sub-rail. The second guide sub-rail is connected to the second guide rail, and the third guide sub-rail is connected to the third guide rail. The clamping module further includes a second clamping unit, a third clamping unit and a fourth clamping unit. The movable bearing unit further includes a second movable bearing module configured to control the second clamping unit to move along the first guide sub-rail, a third movable bearing module configured to control the third clamping unit to move along the second guide sub-rail, and a fourth movable bearing module configured to control the fourth clamping unit to move along the third guide sub-rail.

Alternatively, the first movable bearing module is located at a left side of the second movable bearing module, In the case that the first movable bearing module moves along the first guide sub-rail to the left for a first predetermined distance, the second movable bearing module moves along the first guide sub-rail to the right for the first predetermined distance, and in the case that the first movable bearing module moves along the first guide sub-rail to the right for a second predetermined distance, the second movable bearing module moves along the first guide sub-rail to the left for the second predetermined distance. In the case that the third movable bearing module moves along the second guide sub-rail to the left for a third predetermined distance, the fourth movable bearing module moves along the third guide sub-rail to the right for the third predetermined distance, and in the case that third movable bearing module moves along the second guide sub-rail to the right for a fourth predetermined distance, the fourth movable bearing module moves along the third guide sub-rail to the left for the fourth predetermined distance.

Alternatively, the first clamping unit, the second clamping unit, the third clamping unit and the fourth clamping unit are all clips.

Alternatively, the first movable bearing module is a first step motor, the second movable bearing module is a second step motor, the third movable hearing module is a third step motor, and the fourth movable bearing module is a fourth step motor.

Alternatively, the first position adjustment module includes a first servo motor and a second servo motor. The first servo motor is configured to drive the first guide rail to move along the second guide rail, and the second servo motor is configured to drive the first guide rail to move along the third guide rail. The second position adjustment module includes a third servo motor, a fourth servo motor, a fifth servo motor and a sixth servo motor. The third servo motor is configured to control the first step motor to move along the first guide sub-rail, the fourth servo motor is configured to control the second step motor to move along the first guide sub-rail, the fifth servo motor is configured to control the third step motor to move along the second guide sub-rail, and the sixth servo motor is configured to control the fourth step motor to move along the third guide sub-rail.

Alternatively, the post position adjustment device further includes a post position detection unit configured to send an alarm signal to the movement control unit when detecting that the post is not placed into the target positioning hole. The movement control unit is further configured to, upon the receipt of the alarm signal, control the movement mechanism to move the post-picking-and-placing unit to the target position. The post-picking-and-placing unit is further configured to, after being moved to the target position, install the post into the target positioning hole.

Alternatively, the post position detection unit is a charge coupled device (CCD).

In another aspect, the present disclosure provides in some embodiments a cassette adjustment device, including an adjustment control unit, a retainer movement unit and the above-mentioned post position adjustment device. The adjustment control unit is configured to sequentially send a post picking signal to the post position adjustment device, send a retainer movement signal to the retainer movement unit, and send a post installation signal to the post position adjustment device. The post position adjustment device is configured to, upon the receipt of the post picking signal, pick a post out from a current positioning hole, and upon the receipt of the post installation signal, install the post into a target positioning hole. The retainer movement unit is configured to, upon the receipt of the retainer movement signal, move a retainer from a current retainer position to a predetermined retainer position.

In yet another aspect, the present disclosure provides in some embodiments a substrate conveyance system, including a substrate conveyance device and the above-mentioned cassette adjustment device. The cassette adjustment device is configured to pick a post out from a current positioning hole, move a retainer from a current retainer position to a predetermined retainer position, and install the post into a target positioning hole, so as to adjust a loading space dimension of a cassette. The substrate conveyance device is configured to, after the loading space dimension of the cassette has been adjusted by the cassette adjustment device, convey a substrate into the cassette.

According to the post position adjustment device, the cassette adjustment device and the substrate conveyance system in the embodiments of the present disclosure, it is able to automatically adjust the position of the post in the positioning bar of the cassette and automatically adjust the loading space dimension of the cassette, so as to reduce the labor cost and reduce the losses in the production materials due to the erroneous loading space dimension of the cassette.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1A:
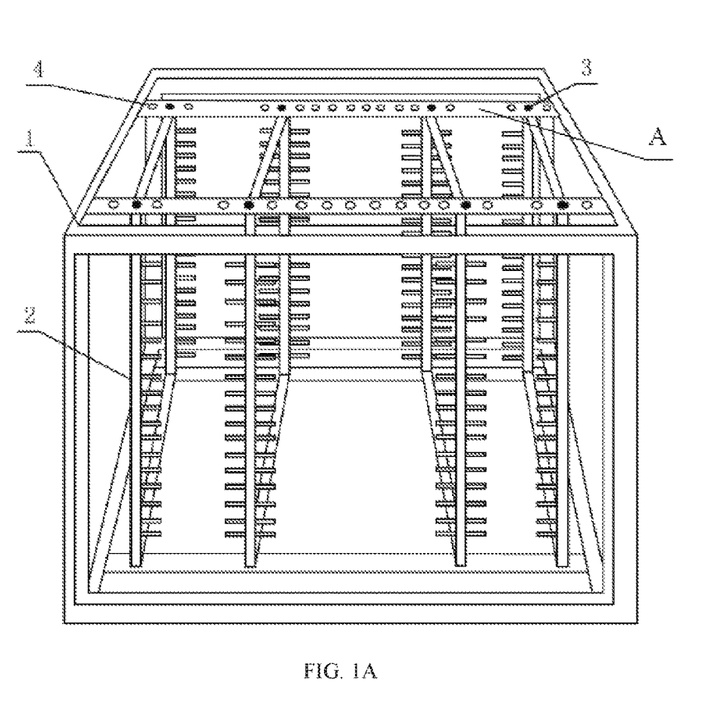
FIG. 1A is a schematic view showing a cassette in the related art.
Figure 1B:
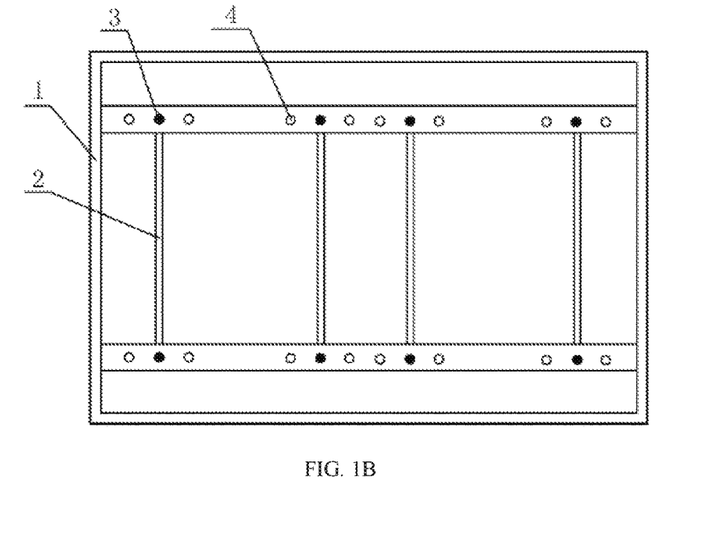
FIG. 1B is a top view of the cassette in FIG. 1A.
Figure 1C:
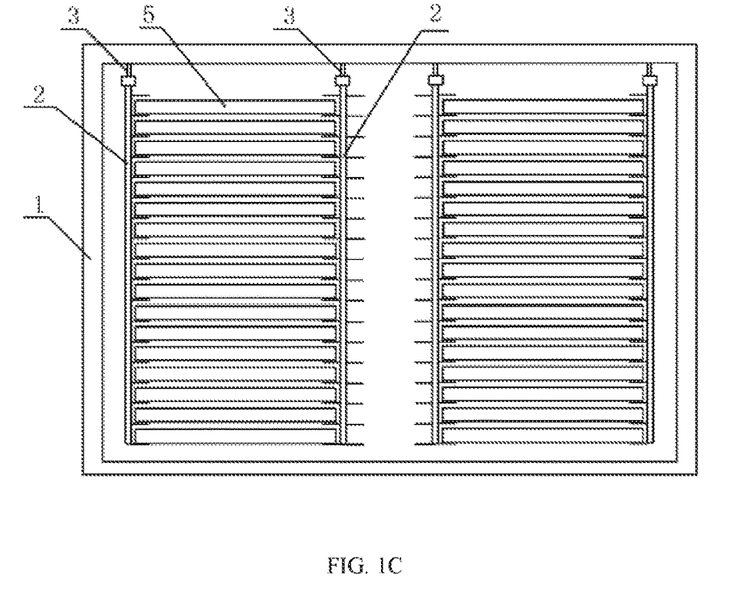
FIG. 1C is a schematic view showing the cassette in FIG. 1A in which small-size display substrates are accommodated.
Figure 1D:
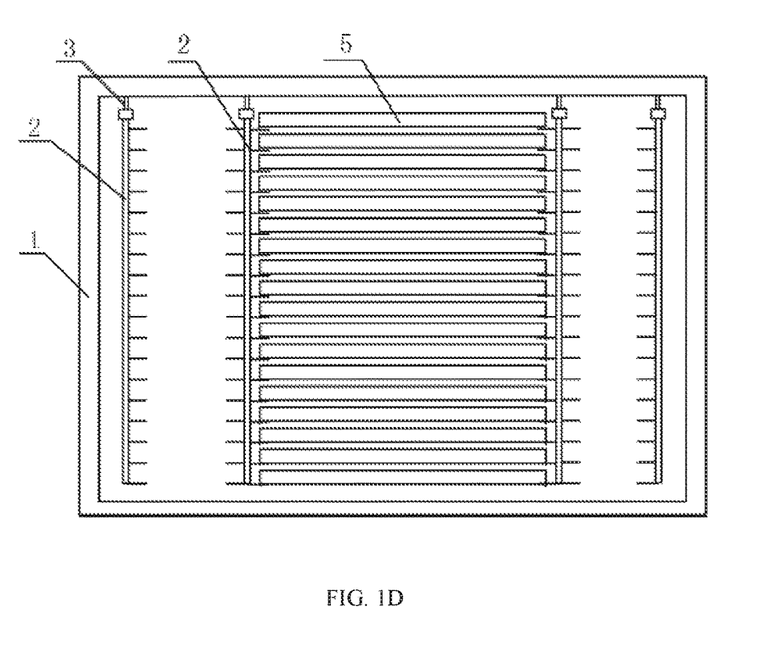
FIG. 1D is a schematic view showing the cassette in FIG. 1A in which large-size display substrates are accommodated.

FIG. 1A is a schematic view showing a cassette in the related art, FIG. 1B is a top view of the cassette in FIG. 1A, FIG. 1C is a schematic view showing the cassette in FIG. 1A in which small-size display substrates are accommodated, and FIGS. 1D is a schematic view showing the cassette in FIG. 1A in which large-size display substrates are accommodated. As shown in FIGS. 1A-1D, the cassette includes a frame 1 and retainers 2 inside the frame 1. Each retainer 2 is provided with a post 3, and the frame 1 is provided with a plurality of positioning holes 4. The post 3 is inserted into the positioning hole 4 so as to fix the retainer 2, thereby to define a loading space dimension of the cassette. In FIG. 1A, the positioning holes 4 are provided in a positioning bar A. The number of the retainers in the cassette may be set in accordance with the practical need. For example, in FIG. 1A. the cassette is provided with four retainers. As shown in FIG. 1C, in the case that small-size display substrates 5 are to be accommodated in the cassette, positions of the four retainers 2 may be adjusted so that a loading space dimension is defined between the two retainers on the left and another loading space dimension is defined between the two retainers on the right. As a result, a loading space defined between the two retainers on the left can accommodate the small-size display substrates 5, and a loading space defined between the two retainers on the right can also accommodate the small-size display substrates 5. As shown in FIG. 1D, in the case that large-size display substrates 5 are to be accommodated in the cassette, the positions of the four retainers 2 may be adjusted so that a loading space dimension is defined between the two retainers 2 in the middle, and then the large-size display substrates 5 can be accommodated in a loading space defined between the two retainers 2 in the middle. In this way, it is able to adjust the positions of the retainers through adjusting engagement between the posts 3 and the variety of positioning holes 4, thereby to enable the loading space dimension of the cassette to be adapted to the size of the display substrate.

Figure 2:
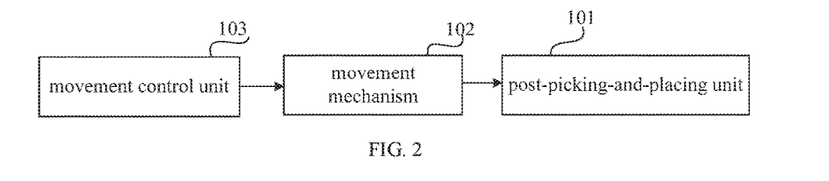
FIG. 2 is a block diagram of a post position adjustment device according to one embodiment of the present disclosure.

As shown in FIG. 2, the present disclosure provides in some embodiments a post position adjustment device, which includes a post-picking-and-placing unit 101, a movement mechanism 102 and a movement control unit 103.

The post-picking-and-placing unit 101 is configured to pick a post from a current positioning hole and place the post into a target positioning hole. The movement mechanism 102 is configured to move the post-picking-and-placing unit 101. The movement control unit 103 is configured to control the movement mechanism 102 to move the post-picking-and-placing unit 101 to a source position where the post is currently located, and after the post has been picked out from the current positioning hole by the post-picking-and-placing unit 101, control the movement mechanism 102 to move the post-picking-and-placing unit 101 to a target position.

During the conveyance of the display substrate, in the case that a type of the display substrates to he accommodated in the cassette is changed a size thereof will be changed correspondingly. At this time, through the post position adjustment device in the embodiments of the present disclosure, the movement control unit may control the movement mechanism to move the post-picking-and-placing unit to the source position where the post is currently located. Then, the post may be picked out by the post-picking-and-placing unit from the current positioning hole, and the movement control unit may control the movement mechanism to move the post-picking-and-placing unit to the target position. Then, the post may be placed by the post-picking-and-placing unit into the target positioning hole. In this way, it is able to automatically adjust the position of the post in the positioning bar of the cassette after the type of the display substrates has been changed.

Figure 4:
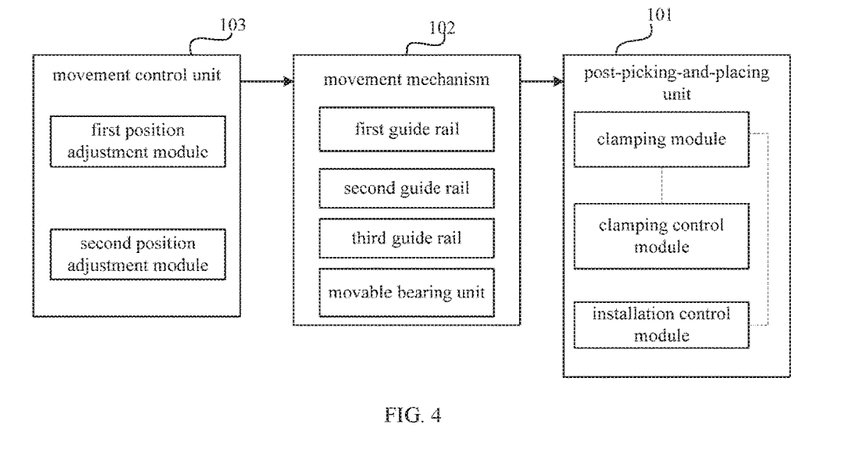
FIG. 4 is another block diagram of the post position adjustment device according to one embodiment of the present disclosure.

To be specific, as shown in FIG. 4, the post-picking-and-placing unit includes a clamping module, a clamping control module and an installation control module. The clamping module is configured to pick the post out from the current positioning hole and install the post into the target positioning hole. The clamping control module is configured to, after the movement mechanism moves the post-picking-and-placing unit to the source position, generate a clamping control signal for controlling the clamping module to pick the post out from the current positioning hole. The installation control module is configured to, after the movement mechanism moves the post-picking-and-placing unit to the target position, generate an installation control signal for controlling the clamping module to install the post into the target positioning hole. During the implementation, the post-picking-and-placing unit may include the clamping module, the clamping control module and the installation control module. The clamping control module is configured to generate the clamping control signal, and the installation control module is configured to generate the installation control signal. Upon the receipt of the clamping control signal and the installation control signal, the clamping module may pick and install the post.

To be specific, as shown in FIG. 4, the movement mechanism includes a first guide rail, a second guide rail and a moveable bearing unit.

The first guide rail is arranged parallel to the positioning bar in which the positioning hole is provided. A plane defined by the first guide rail and the positioning bar is perpendicular to a plane where the positioning bar is located. The second guide rail is arranged perpendicular to the plane where the positioning bar is located. The movable bearing unit is movable along the first guide rail and configured to bear the clamping module. The first guide rail is movable along the second guide rail.

During the implementation, the movement mechanism may include the first guide rail, the second guide rail and the movable bearing unit for bearing the clamping module. The movable bearing unit may move along the first guide rail, and the first guide rail may move along the second guide rail. In this way, it is able to move the clamping module to a position where the post may be picked out or placed conveniently.

To be specific, as shown in FIG. 4, the movement control unit includes a first position adjustment module configured to control the movable bearing unit to move along the first guide rail, and a second position adjustment module configured to control the first guide rail to move along the second guide rail.

During the implementation, the movement control unit may include the first position adjustment module configured to control the movable bearing unit to move along the first guide rail and the second position adjustment module configured to move the first guide rail along the second guide rail. In this way, it is able to move the clamping module to the source position and the target position accurately.

To be specific, the first guide rail includes a first guide sub-rail, and the clamping module includes a first clamping unit. The movable bearing unit includes a first movable bearing module for controlling the first clamping unit to move along the first guide sub-rail.

To be specific, the movement mechanism further includes a third guide rail arranged perpendicular to the plane where the positioning bar is located. The first guide rail is movable along the third guide rail. A first end of the first guide sub-rail is connected to the second guide rail, and a second end of the first guide sub-rail is connected to the third guide rail.

In the embodiments of the present disclosure, the additional third guide rail may be arranged perpendicular to the plane where the positioning bar is located, and the first guide sub-rail may move along the second guide rail and the third substrate. The first end of the first guide sub-rail is connected to the second guide rail, and the second end of the first guide sub-rail is connected to the third guide rail. In this way, it is able to move the first guide sub-rail in a stable manner.

To be specific, the first guide rail further includes a second guide sub-rail and a third guide sub-rail. A length of the second guide sub-rail and a length of the third guide sub-rail are each less than a length of the first guide sub-rail. The second guide sub-rail is connected to the second guide rail, and the third guide sub-rail is connected to the third guide rail.

The clamping module further includes a second clamping unit, a third clamping unit and a fourth clamping unit. The movable bearing unit further includes a second movable bearing module configured to control the second clamping unit to move along the first guide sub-rail 211, a third movable bearing module configured to control the third clamping unit to move along the second guide sub-rail 212, and a fourth movable bearing module configured to control the fourth clamping unit to move along the third guide sub-rail.

In the embodiments of the present disclosure, the additional second guide sub-rail has a length smaller than the first guide sub-rail and is connected to the second guide rail, and the additional third guide sub-rail has a length smaller than the first guide sub-rail and is connected to the third guide rail. Accordingly, the moveable bearing unit includes the additional second, third and fourth movable bearing modules. Apart from the first clamping unit movable along the first guide sub-rail under the control of the first movable bearing module, the clamping module further includes the second clamping unit movable along the first guide sub-rail under the control of the second movable bearing module, the third clamping unit movable along the second guide sub-rail under the control of the third movable bearing module, and the fourth clamping unit movable along the third guide sub-rail under the control of the fourth movable bearing module. In this way, the first clamping unit may be controlled to pick and place of the post, which is on the left side of the cassette, adjacent to the middle of the cassette and in the positioning bar; the second clamping unit may be controlled to pick and place of the post, which is on the right side of the cassette, adjacent to the middle of the cassette and in the positioning bar; the third clamping unit may be controlled to pick and place of the post, which is on the left side of the cassette, adjacent to an edge of the cassette and in the positioning bar; the fourth clamping unit may be controlled to pick and place of the post, which is on the right side of the cassette, adjacent to an edge of the cassette and in the positioning bar. In this way, the time desired for adjusting the cassette may be reduced.

To be specific, the first movable bearing module is located at a left side of the second movable bearing module, Alternatively, in the case that the first movable bearing module moves along the first guide sub-rail to the left for a first predetermined distance, the second movable bearing module moves along the first guide sub-rail to the right for the first predetermined distance; and in the case that the first movable bearing module moves along the first guide sub-rail to the right for a second predetermined distance, the second movable bearing module moves along the first guide sub-rail to the left for the second predetermined distance. In the case that the third movable bearing module moves along the second guide sub-rail to the left for a third predetermined distance, the fourth movable bearing module moves along the third guide sub-rail to the right for the third predetermined distance; and in the case that third movable bearing module moves along the second guide sub-rail to the right for a fourth predetermined distance, the fourth movable bearing module moves along the third guide sub-rail to the left for the fourth predetermined distance.

During the actual application, the posts in the positioning bar are arranged symmetrically on the left and on the right of the cassette. Thus, the movement distance of the first movable bearing module along the first guide sub-rail to the left is set as identical to the movement distance of the second movable bearing module along the first guide sub-rail to the right, and the movement distance of the first movable bearing module along the first guide sub-rail to the right is set as identical to the movement distance of the second movable bearing module along the first guide sub-rail to the left. In this way, it is able to adjust the loading space dimension of the cassette merely through a single movement control signal in accordance with the type of the display substrate.

To be specific, the post position adjustment device further includes a post position detection unit configured to send an alarm signal to the movement control unit when detecting that the adjusted post is not installed into the target positioning hole. The movement control unit is further configured to, upon the receipt of the alarm signal, control the movement mechanism to move the post-picking-and-placing unit to the target position. The post-picking-and-placing unit is further configured to, after being moved to the target position, install the post into the target positioning hole.

During the implementation, the post position detection unit may be a charge coupled device (CCD, which is a semiconductor imaging device) and is configured to detect whether or not the adjusted post is located at a right position. In the case that the post is not located at the right position, the movement control unit is further configured to, upon the receipt of the alarm signal, control the movement mechanism to move the post-picking-and-placing unit to the target position, thereby installing the post into the target positioning hole. In this way, it is able to correct the position of the post in an accurate manner.

The present disclosure provides in some embodiments a cassette adjustment device, including an adjustment control unit, a retainer movement unit and the above-mentioned post position adjustment device. The adjustment control unit is configured to sequentially send a post picking signal to the post position adjustment device, send a retainer movement signal to the retainer movement unit, and send a post installation signal to the post position adjustment device. The post position adjustment device is configured to, upon the receipt of the post picking signal, pick a post out from a current positioning hole, and upon the receipt of the post installation signal, install the post into a target positioning hole. The retainer movement unit is configured to, upon the receipt of the retainer movement signal, move a retainer from a current retainer position to a predetermined retainer position.

Figure 5:
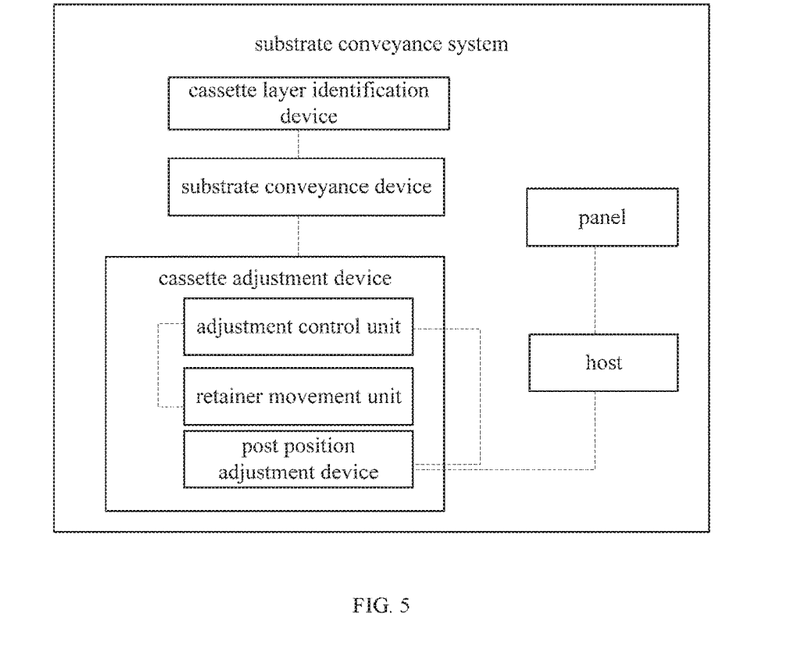
FIG. 5 is a block diagram of a substrate conveyance system according to one embodiment of the present disclosure.

As shown in FIG. 5, the present disclosure provides in some embodiments a substrate conveyance system, including a substrate conveyance device and the above-mentioned cassette adjustment device. The cassette adjustment device is configured to pick a post out from a current positioning hole, move a retainer from a current retainer position to a predetermined retainer position, and place the post into a target positioning hole, so as to adjust a loading space dimension of a cassette. The substrate conveyance device is configured to, after the loading space dimension of the cassette has been adjusted by the cassette adjustment device, convey a substrate into the cassette.

The post position adjustment device will described hereinafter with an example.

Figure 3:
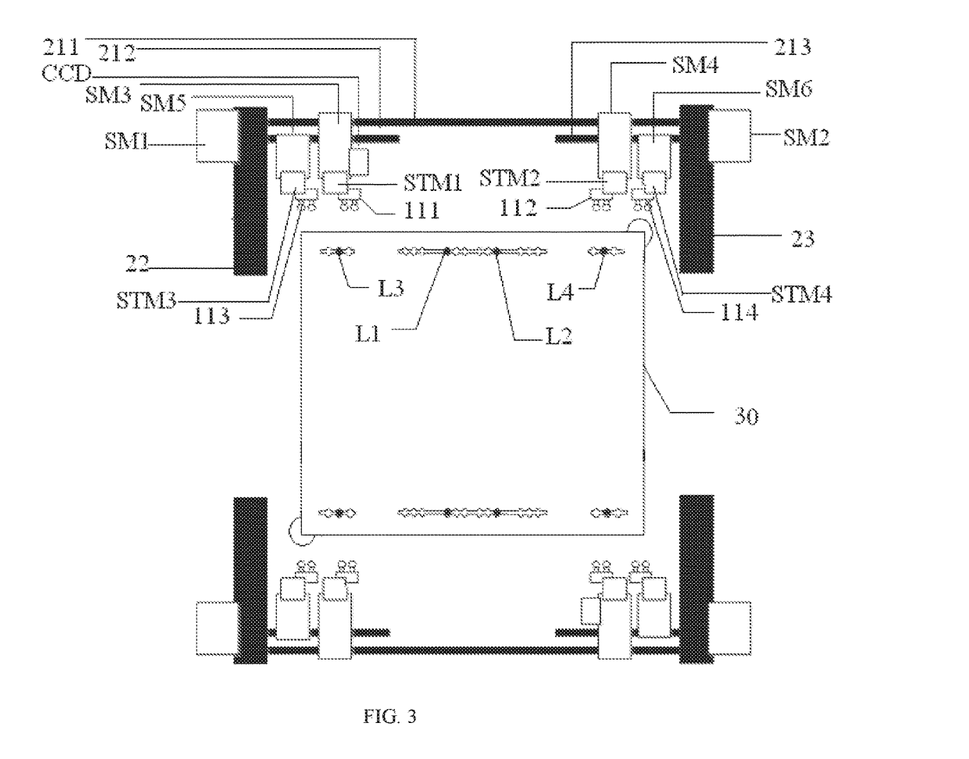
FIG. 3 is a schematic view showing the post position adjustment device according to one embodiment of the present disclosure.

As shown in FIG. 3, the post position adjustment device includes the first guide rail, the second guide rail 22, the third guide rail 23, the post-picking-and-placing unit, the movable bearing unit and the movement control unit. The first guide rail, the second guide rail 22, the third guide rail 23 and the movable bearing unit may define the above movement mechanism.

The first guide rail includes the first guide sub-rail 211, the second guide sub-rail and the third guide sub-rail 213 which are arranged parallel to each other. The length of the second guide sub-rail 212 and the length of the third guide sub-rail 213 are each smaller than the length of the first guide sub-rail 211.

The second guide rail 22 is connected to a left end of the first guide sub-rail 211 and a left end of the second guide sub-rail 212. The first guide sub-rail 211 and the second guide sub-rail 212 are movable along the second guide rail 22.

The third guide rail 23 is connected to a right end of the first gut sub-rail 211 and a right end of the third guide sub-rail 213. The first guide sub-rail 211 and the third guide sub-rail 213 are movable along the third guide rail 23.

As shown in FIG. 4, the post-picking-and-placing unit includes the clamping module, the clamping control module and the installation control module.

The clamping module is configured to pick the post out from the current positioning hole and install the post into the target positioning hole. The clamping control module is configured to, after the movement mechanism moves the post-picking-and-placing unit to the source position, generate the clamping control signal for controlling the clamping module to pick the post out from the current positioning hole. The installation control module is configured to, after the movement mechanism moves the post-picking-and-placing unit to the target position, generate the installation control signal for controlling the clamping module to install the post into the target positioning hole.

As shown in FIG. 3, the clamping module includes the first clamping unit 111, the second clamping unit 112, the third clamping unit 113 and the fourth clamping unit 114.

During the actual application, the first clamping unit 111, the second clamping unit 112, the third clamping unit 113 and the fourth clamping unit 114 may be clips.

The movable bearing unit includes the first movable bearing module, e.g., a first step motor STM1, the second movable bearing module, e.g., a second step motor STM2, the third movable bearing module, e.g., a third step motor STM3, and the fourth movable bearing module, e.g., a fourth step motor STM4.

The first step motor STM1 is configured to control the first clamping unit 111 to move along the first guide sub-rail 211. The second step motor STM2 is configured to control the second clamping unit 112 to move along the first guide sub-rail 211. The third step motor STM3 is configured to control the third clamping unit 113 to move along the second guide sub-rail 212. The fourth step motor STM4 is configured to control the fourth clamping unit 114 to move along the third guide sub-rail 213.

As shown in FIG. 4, the movement control unit may include the first position adjustment module and the second position adjustment module. The first position adjustment module is configured to control the movable bearing unit to move along the first guide rail. The second position adjustment module is configured to control the first guide rail to move along the second guide rail 22 and control the first guide rail to move along the third guide rail 23.

During the actual application, as shown in FIG. 3, the first position adjustment module may include a first servo motor SM1 and a second servo motor SM2. The first servo motor SM1 is configured to drive the first guide rail to move along the second guide rail 22. The second servo motor SM2 is configured to drive the first guide rail to move along the third guide rail 23, The second position adjustment module may include a third servo motor SM3, a fourth servo motor SM4, a fifth servo motor SM5 and a sixth servo motor SM6. The third servo motor SM3 is configured to control the first step motor STM1 to move along the first guide sub-rail 211. The fourth servo motor SM4 is configured to control the second step motor STM2 to move along the first guide sub-rail 211. The fifth servo motor SM5 is configured to control the third step motor STM3 to move along the second guide sub-rail 212. The sixth servo motor SM6 is configured to control the fourth step motor STM4 to move along the third guide sub-rail 213.

In FIG. 3, a CCD is arranged on the SM3 so as to detect the position of the post, thereby to determine whether or not the adjusted loading space dimension of the cassette is appropriate.

In FIG. 3, the first guide sub-rail 211, the second guide sub-rail 212 and the third guide sub-rail 213 are arranged parallel to the positioning bar at an upper surface of the cassette. A plane defined by the first guide rail and the positioning bar is arranged perpendicular to a plane where the positioning bar is located. The second guide rail 22 and the third guide rail 23 are each arranged perpendicular to the plane in which the positioning bar is located.

In FIG. 3, the cassette for accommodating therein the display substrates is indicated by 30, and a first post is indicated by L1. In the case that the type of the display substrate is not changed, the first post L1 is arranged in a current positioning hole, which is at a left side of and adjacent to a middle of the positioning bar at the upper surface of the cassette 30.

A second post is indicated by L2. In the case that the type of the display substrate is not changed, the second post L2 is arranged in a current positioning hole, which is at a right side of and adjacent to the middle of the positioning bar at the upper surface of the cassette 30.

A third post is represented by L3. In the case that the type of the display substrate is not changed, the third post L3 is arranged in a current positioning hole, which is at the left side of and adjacent to an edge of the positioning bar at the upper surface of the cassette 30.

A fourth post is indicated by L4. In the case that the type of the display substrate is not changed, the fourth post L4 is arranged in a current positioning hole, which is at the right side of and adjacent to an edge of the positioning bar at the upper surface of the cassette 30.

During the implementation, in FIG. 3, the post position adjustment device is arranged not only above the upper surface of the cassette 30, but also under the bottom of the cassette 30.

In the case that the type of display substrate is changed, the cassette 30 may be placed into the cassette adjustment device including the post position adjustment device.

At first, as shown in FIG. 5, a type of the current display substrate and a type of the display substrate to be accommodated in the cassette 30 may be inputted through a touch panel. After a host sends a signal to change the types of the display substrates, the third servo motor SM3 drives the first step motor STM1, which carries the first clamping unit 111, to move along the first guide sub-rail 211 to a position above the first post L1. The fourth servo motor SM4 drives the second step motor STM2, which carries the second clamping unit 112, to move along the first guide sub-rail 211 to a position above the second post L2. The fifth servo motor SM5 drives the third step motor STM3, which carries the third clamping unit 113, to move along the second guide sub-rail 212 to a position above the third post L3. The sixth servo motor SM6 drives the fourth step motor STM4, which carries the fourth clamping unit 114, to move along the third guide sub-rail 213 to a position above the fourth post L4.

Then, the first servo motor SM1 and the second servo motor SM2 drive the first guide sub-rail 211, the second guide sub-rail 212 and the third guide sub-rail 213 to move downward (at this time, the first guide rail of the post position adjustment device under the bottom of the cassette 30 moves upward), so that the clamping units may pick the posts out from the corresponding current positioning holes, and the retainer movement unit moves the retainers from the current retainer positions to the predetermined retainer positions. Next, the clamping units are driven to move to the target position holes, so as to install the posts into the corresponding target positioning holes. In this way, it is able to automatically adjust the positions of the posts and adjust the loading space dimensions of the cassette. In addition, after the positions of the posts have been adjusted, the CCD may determine whether or not the adjusted positions of the posts are correct, and if not, the positions of the posts may be adjusted in real time.

During the operation of the cassette adjustment device, after the loading space dimension of the cassette corresponding to the selected type of the display substrate has been determined through the positioning function of the servo motor, it is able to adjust the loading space dimension of the cassette by means of the touch panel. In this way, it is able to reduce the labor cost and the loss in the production materials due to the erroneous loading space dimension of the cassette. The host may send the signal for changing the type of the display substrate, and the cassette adjustment device may adjust the loading space dimension of the cassette in accordance with the signal. A detection device such as the post position detection unit (e.g., the CCD) may determine whether or not the adjusted cassette is adapted to the changed type of the display substrate, and if yes, the substrate conveyance device may send a signal indicating the type of the display substrate. A cassette layer identification unit may identify the number of the layers in the cassette, and send a conveyance command to the substrate conveyance device. Finally, the substrate conveyance device conveys the display substrates in accordance with the conveyance command.

The above are merely the optional embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A post position adjustment device comprising:
a post-picking-and-placing unit configured to pick a post out from a current positioning hole and install the post into a target positioning hole;
a movement mechanism configured to move the post-picking-and-placing unit; and
a movement control unit configured to control the movement mechanism to move the post-picking-and-placing unit to a source position where the post is currently located, and after the post has been picked out from the current positioning hole by the post-picking-and-placing unit, control the movement mechanism to move the post-picking-and-placing unit to a target position,
wherein the post-picking-and-placing unit comprises:
a clamping module configured to pick the post out from the current positioning hole and install the post into the target positioning hole;
a clamping control module configured to, after the movement mechanism moves the post-picking-and-placing unit to the source position, generate a clamping control signal for controlling the clamping module to pick the post out from the current positioning hole; and
an installation control module configured to, after the movement mechanism moves the post-picking-and-placing unit to the target position, generate an installation control signal for controlling the clamping module to install the post into the target positioning hole.

2. The post position adjustment device according to claim 1, wherein the movement mechanism comprises:
a first guide rail parallel to a positioning bar in which the positioning hole is, a plane defined by the first guide rail and the positioning bar being perpendicular to a plane where the positioning bar is located;
a second guide rail perpendicular to the plane where the positioning bar is located; and
a movable bearing unit movable along the first guide rail and configured to bear the clamping module;
wherein the first guide rail is movable along the second guide rail.

3. The post position adjustment device according to claim 2, wherein the movement control unit comprises:
a first position adjustment module configured to control the movable bearing unit to move along the first guide rail; and
a second position adjustment module configured to control the first guide rail to move along the second guide rail.

4. The post position adjustment device according to claim 3, wherein the first guide rail comprises a first guide sub-rail, the clamping module comprises a first clamping unit, the movable bearing unit comprises a first movable bearing module for controlling the first clamping unit to move along the first guide sub-rail.

5. The post position adjustment device according to claim 4, wherein the movement mechanism further comprises a third guide rail perpendicular to the plane where the positioning bar is located, the first guide rail is movable along the third guide rail; a first end of the first guide sub-rail is connected to the second guide rail, and a second end of the first guide sub-rail is connected to the third guide rail.

6. The post position adjustment device according to claim 5, wherein the first guide rail further comprises a second guide sub-rail and a third guide sub-rail, and a length of the second guide sub-rail and a length of the third guide sub-rail are each less than a length of the first guide sub-rail;
the second guide sub-rail is connected to the second guide rail, and the third guide sub-rail is connected to the third guide rail;
the clamping module further comprises a second clamping unit, a third clamping unit and a fourth clamping unit; and
the movable bearing unit further comprises a second movable bearing module configured to control the second clamping unit to move along the first guide sub-rail, a third movable bearing module configured to control the third clamping unit to move along the second guide sub-rail, and a fourth movable bearing module configured to control the fourth clamping unit to move along the third guide sub-rail.

7. The post position adjustment device according to claim 6, wherein the first movable bearing module is at a left side of the second movable bearing module;
in the case that the first movable bearing module moves along the first guide sub-rail to the left for a first predetermined distance, the second movable bearing module moves along the first guide sub-rail to the right for the first predetermined distance; and in the case that the first movable bearing module moves along the first guide sub-rail to the right for a second predetermined distance, the second movable bearing module moves along the first guide sub-rail to the left for the second predetermined distance; and
in the case that the third movable bearing module moves along the second guide sub-rail to the left for a third predetermined distance, the fourth movable bearing module moves along the third guide sub-rail to the right for the third predetermined distance; and in the case that third movable bearing module moves along the second guide sub-rail to the right for a fourth predetermined distance, the fourth movable bearing module moves along the third guide sub-rail to the left for the fourth predetermined distance.

8. The post position adjustment device according to claim 6, wherein the first clamping unit, the second clamping unit, the third clamping unit and the fourth clamping unit are all clips.

9. The post position adjustment device according to claim 6, wherein the first movable bearing module is a first step motor, the second movable bearing module is a second step motor, the third movable bearing module is a third step motor, and the fourth movable bearing module is a fourth step motor.

10. The post position adjustment device according to claim 9, wherein the first position adjustment module comprises a first servo motor and a second servo motor;
the first servo motor is configured to drive the first guide rail to move along the second guide rail, and the second servo motor is configured to drive the first guide rail to move along the third guide rail;
the second position adjustment module comprises a third servo motor, a fourth servo motor, a fifth servo motor and a sixth servo motor; and
the third servo motor is configured to control the first step motor to move along the first guide sub-rail, the fourth servo motor is configured to control the second step motor to move along the first guide sub-rail, the fifth servo motor is configured to control the third step motor to move along the second guide sub-rail, and the sixth servo motor is configured to control the fourth step motor to move along the third guide sub-rail.

11. The post position adjustment device according to claim 1, further comprising a post position detection unit configured to send an alarm signal to the movement control unit when detecting that the post is not placed into the target positioning hole;
wherein the movement control unit is further configured to, upon the receipt of the alarm signal, control the movement mechanism to move the post-picking-and-placing unit to the target position, and
the post-picking-and-placing unit is further configured to, after being moved to the target position, install the post into the target positioning hole.

12. The post position adjustment device according to claim 11, wherein the post position detection unit is a charge coupled device (CCD).

13. A cassette adjustment device, comprising an adjustment control unit, a retainer movement unit and a post position adjustment device, wherein
the post position adjustment device comprises:
a post-picking-and-placing unit configured to pick a post out from a current positioning hole and install the post into a target positioning hole;
a movement mechanism configured to move the post-picking-and-placing unit and
a movement control unit configured to control the movement mechanism to move the post-picking-and-placing unit to a source position where the post is currently located, and after the post has been picked out from the current positioning hole by the post-picking-and-placing unit, control the movement mechanism to move the post-picking-and-placing unit to a target position,
wherein the adjustment control unit is configured to sequentially send a post picking signal to the post position adjustment device, send a retainer movement signal to the retainer movement unit, and send a post installation signal to the post position adjustment device;
the post position adjustment device is configured to, upon the receipt of the post picking signal, pick a post out from a current positioning hole, and upon the receipt of the post installation signal, install the post into a target positioning hole; and
the retainer movement unit is configured to, upon the receipt of the retainer movement signal, move a retainer from a current retainer position to a predetermined retainer position.

14. The cassette adjustment device according to claim 13, wherein the post-picking-and-placing unit comprises:
a clamping module configured to pick the post out from the current positioning hole and install the post into the target positioning hole;
a clamping control module configured to, after the movement mechanism moves the post-picking-and-placing unit to the source position, generate a clamping control signal for controlling the clamping module to pick the post out from the current positioning hole; and
an installation control module configured to, after the movement mechanism moves the post-picking-and-placing unit to the target position, generate an installation control signal for controlling the clamping module to install the post into the target positioning hole.

15. The cassette adjustment device according to claim 14, wherein the movement mechanism comprises:
a first guide rail parallel to a positioning bar in which the positioning hole is, a plane defined by the first guide rail and the positioning bar being perpendicular to a plane where the positioning bar is located;
a second guide rail perpendicular to the plane where the positioning bar is located; and
a movable bearing unit movable along the first guide rail and configured to bear the clamping module;
wherein the first guide rail is movable along the second guide rail.

16. The cassette adjustment device according to claim 15, wherein the movement control unit comprises:
a first position adjustment module configured to control the movable bearing unit to move along the first guide rail; and
a second position adjustment module configured to control the first guide rail to move along the second guide rail.

17. A substrate conveyance system, comprising a substrate conveyance device and a cassette adjustment device, wherein
the cassette adjustment device comprises an adjustment control unit, a retainer movement unit and a post position adjustment device,
the post position adjustment device comprises:
a post-picking-and-placing unit configured to pick a post out from a current positioning hole and install the post into a target positioning hole;
a movement mechanism configured to move the post-picking-and-placing unit and
a movement control unit configured to control the movement mechanism to move the post-picking-and-placing unit to a source position where the post is currently located, and after the post has been picked out from the current positioning hole by the post-picking-and-placing unit, control the movement mechanism to move the post-picking-and-placing unit to a target position, the adjustment control unit is configured to sequentially send a post picking signal to the post position adjustment device, send a retainer movement signal to the retainer movement unit, and send a post installation signal to the post position adjustment device;

the post position adjustment device is configured to, upon the receipt of the post picking signal, pick a post out from a current positioning hole, and upon the receipt of the post installation signal, install the post into a target positioning hole; and the retainer movement unit is configured to, upon the receipt of the retainer movement signal, move a retainer from a current retainer position to a predetermined retainer position, wherein the cassette adjustment device is configured to pick a post out from a current positioning hole, move a retainer from a current retainer position to a predetermined retainer position, and install the post into a target positioning hole, so as to adjust a loading space dimension of a cassette, and the substrate conveyance device is configured to, after the loading space dimension of the cassette has been adjusted by the cassette adjustment device, convey a substrate into the cassette.

18. The substrate conveyance system according to claim 17, wherein the post-picking-and-placing unit comprises:

a clamping module configured to pick the post out from the current positioning hole and install the post into the target positioning hole;

a clamping control module configured to, after the movement mechanism moves the post-picking-and-placing unit to the source position, generate a clamping control signal for controlling the clamping module to pick the post out from the current positioning hole; and an installation control module configured to, after the movement mechanism moves the post-picking-and-placing unit to the target position, generate an installation control signal for controlling the clamping module to install the post into the target positioning hole.

19. The substrate conveyance system according to claim 18, wherein the movement mechanism comprises:

a first guide rail parallel to a positioning bar in which the positioning hole is, a plane defined by the first guide rail and the positioning bar being perpendicular to a plane where the positioning bar is located;

a second guide rail perpendicular to the plane where the positioning bar is located; and a movable bearing unit movable along the first guide rail and configured to bear the clamping module;

wherein the first guide rail is movable along the second guide rail.

20. The substrate conveyance system according to claim 19, wherein the movement control unit comprises:

a first position adjustment module configured to control the movable bearing unit to move along the first guide rail; and a second position adjustment module configured to control the first guide rail to move along the second guide rail.

\* \* \* \* \*